(12) United States Patent
Wang et al.

(10) Patent No.: US 9,379,418 B2
(45) Date of Patent: Jun. 28, 2016

(54) BATTERY WITH REFERENCE ELECTRODE FOR VOLTAGE MONITORING

(71) Applicant: HRL Laboratories, LLC, Malibu, CA (US)

(72) Inventors: John Wang, Los Angeles, CA (US); Ping Liu, Irvine, CA (US); Elena Sherman, Culver City, CA (US); Souren Soukiazian, Agoura, CA (US); Mark Verbrugge, Troy, MI (US)

(73) Assignee: HRL Laboratories, LLC, Malibu, CA (US)

( * ) Notice: Subject to any disclaimer, the term of this patent is extended or adjusted under 35 U.S.C. 154(b) by 336 days.

(21) Appl. No.: 13/923,354

(22) Filed: Jun. 20, 2013

(65) Prior Publication Data

US 2014/0375325 A1 Dec. 25, 2014

(51) Int. Cl.
| | |
|---|---|
| H01M 14/00 | (2006.01) |
| H01M 10/48 | (2006.01) |
| G01R 31/36 | (2006.01) |
| H01M 10/04 | (2006.01) |
| H01M 10/0525 | (2010.01) |
| H01M 10/42 | (2006.01) |
| H01M 4/70 | (2006.01) |
| H01M 10/058 | (2010.01) |

(52) U.S. Cl.
CPC .............. *H01M 10/48* (2013.01); *G01R 31/362* (2013.01); *H01M 4/70* (2013.01); *H01M 10/0431* (2013.01); *H01M 10/058* (2013.01); *H01M 10/0525* (2013.01); *H01M 10/425* (2013.01); *H01M 10/488* (2013.01); *Y02E 60/122* (2013.01)

(58) Field of Classification Search
None
See application file for complete search history.

(56) References Cited

U.S. PATENT DOCUMENTS

| | | | |
|---|---|---|---|
| 8,163,410 B2 | 4/2012 | Fulop et al. | |
| 8,268,148 B2 | 9/2012 | Kirchev et al. | |
| 2007/0002523 A1* | 1/2007 | Ando et al. | 361/503 |
| 2009/0104510 A1* | 4/2009 | Fulop et al. | 429/50 |
| 2010/0216027 A1* | 8/2010 | Fujii | 429/246 |
| 2011/0086267 A1 | 4/2011 | Yamamoto | |
| 2011/0250478 A1* | 10/2011 | Timmons et al. | 429/91 |
| 2013/0009604 A1 | 1/2013 | Bhardwaj et al. | |

FOREIGN PATENT DOCUMENTS

JP 2011003318 A 1/2011

OTHER PUBLICATIONS

Zhou and Notten, "Development of reliable lithium microference electrodes for long-term in situ studies of lithium-based battery systems," J. Electrochem. Soc. 151(12) (2004) A2173-A2179.

* cited by examiner

*Primary Examiner* — Patrick Ryan
*Assistant Examiner* — Jose Colucci Rios
(74) *Attorney, Agent, or Firm* — O'Connor & Company

(57) ABSTRACT

A lithium-ion battery structure with a third electrode as reference electrode is disclosed. The reference electrode may be fabricated from lithium metal, lithiated carbon, or a variety of other lithium-containing electrode materials. A porous current collector allows permeation of reference lithium ions from the reference electrode to the cathode or anode, enabling voltage monitoring under actual operation of a lithium-ion battery. The reference electrode therefore does not need to be spatially between the battery anode and cathode, thus avoiding a shielding effect. The battery structure includes an external reference circuit to dynamically display the anode and cathode voltage. The battery structure can result in improved battery monitoring, enhanced battery safety, and extended battery life.

35 Claims, 9 Drawing Sheets

BATTERY WITH REFERENCE ELECTRODE FOR VOLTAGE MONITORING

FIELD OF THE INVENTION

The present invention generally relates to electrochemical system structures (such as, but not limited to, lithium-ion batteries) that enable accurate monitoring of electrode potentials under system operation.

BACKGROUND OF THE INVENTION

An electrochemical system is a system that either derives electrical energy from chemical reactions, or facilitates chemical reactions through the introduction of electrical energy. An electrochemical system generally includes a cathode, an anode, and an electrolyte, and is typically complex with multiple heterogeneous subsystems, multiple scales from nanometers to meters. Examples of these systems include fuel cells, batteries, and electroplating systems. On-line characterization of batteries or fuel cells in vehicles is difficult, due to very rough noisy environments.

On-line characterization of such electrochemical systems is desirable in many applications, which include real-time evaluation of in-flight batteries on a satellite or aviation vehicle, and dynamic diagnostics of traction batteries for electric and hybrid-electric vehicles. In many battery-powered systems, the efficiency of batteries can be greatly enhanced by intelligent management of the electrochemical energy storage system. Management is only possible with proper diagnosis of the battery states.

Batteries based on lithium (Li), such as lithium-ion batteries, are attractive due to their high energy density compared to other commercial batteries. Lithium-ion batteries are used commercially in computers, cell phones, and related devices. Battery lifetime is often a critical factor in the marketplace, especially for commercial, military, and aerospace applications. Battery life is often the limiting factor in many aerospace products, such as satellites. Unfortunately, lithium-ion batteries have caused fires in cars, computers, mobile devices, and aircraft. Thus, there is a safety need to dynamically monitor the battery states.

Thus in many lithium-ion battery applications it is preferred to periodically or continuously monitor the electrochemical potential of the electrode materials in the battery as a measure of their state of charge or state of health. Knowledge of the state of charge or state of health may be important for high charge rate or high discharge rate applications such as power tools and partially or fully electrified vehicles. The electrochemical potential of electrode materials may be altered and permanently lost if, for example, the cells of the battery are discharged too rapidly or overcharged often causing lithium to plate on the surface of the negative electrode.

In order to monitor the electrode materials, a reference electrode has been placed in one or more cells of the battery in such a way as to monitor the state of charge of at least one or both of the positive and/or negative electrodes of the cell. The connection is a high-impedance connection that draws very little current from the positive or negative electrode, but the potential (voltage) of the positive and/or negative electrode in the cell electrolyte with respect to the reference is measured. These voltage values (reference electrode vs. positive and/or negative electrode) may be obtained in a battery as the cells are being charged or discharged, and collected for computer analysis and control of the discharge and charge rates of a battery.

Conventional reference electrodes are often inserted between the positive and the negative electrodes and their area is usually kept small in order to minimize the "shielding effect" that distorts the current path between the positive and negative electrodes. However, a small electrode area can lead to large polarization resistance that can potentially give inaccurate potential readings. Other conventional methods involve placing the reference electrode surrounding the battery outside of the direct current path between the positive and negative electrodes. The drawbacks of these designs are that the system measures the potential of electrode edges which rarely represent the true potential of the electrode. Such distortion is further exaggerated at high current densities.

For example, Zhou and Notten, "Development of reliable lithium microference electrodes for long-term in situ studies of lithium-based battery systems," *J. Electrochem. Soc.* 151 (12) (2004) A2173-A2179 report the use of micrometer-scale wire as a lithium reference electrode. The micrometer size wire is sandwiched between the positive and negative electrode. This allows very short distance to the target electrodes to minimize the IR drop while avoiding significant distortion of current pathway due to the shielding effect. However, its use at high rate is questionable when the shielding effect becomes more pronounced. In addition, it can be impractical to implement micrometer-size reference electrodes.

In U.S. Patent App. Pub. No. 2011/0250478, Timmons and Verbrugge disclose the use of a cluster or array of reference electrode materials to monitor the state of charge of the positive and negative electrodes in a lithium-ion battery. An array of lithium-containing reference electrode materials is disposed on a common substrate. Each of the reference electrode materials can be a very small amount. Multiple reference electrode materials are used to determine the potential drifts.

In U.S. Pat. No. 8,163,410, Fulop et al. disclose the use of lithium, lithium titanium oxide and lithium iron phosphate as reference electrodes for battery state of charge and state of health monitoring. The locations of the reference electrodes include on the surface of the can or the endcap of the battery. A wire format reference electrode is disposed near the edge of the electrode stack or sandwiched in between the layers.

A practical approach is needed to improve battery diagnosis and battery management systems for the current state-of-the-art batteries (such as Li-ion batteries). The direct benefits include improving battery monitoring, enhancing battery safety, better understanding of battery aging diagnosis, and extending battery life. Direct measurements of the battery electrode potentials can greatly improve the battery safety and enhance the accuracy and reliability of battery managements.

In light of these and other shortcomings and needs in the art, improved battery structures are needed. Knowledge of battery health/life information as well as battery safety is economically critical in the marketplace. An improved battery structure and reference electrode design to measure the potentials of the positive and negative electrodes is desired, in order to facilitate battery state of charge and state of health monitoring.

SUMMARY OF THE INVENTION

The present invention addresses the aforementioned needs in the art, as will now be summarized and further described in detail below.

In some variations, the invention provides a metal-ion battery structure comprising:

(a) a first electrode disposed adjacent to a first current collector, wherein the first electrode supplies or accepts selected battery metal ions;

(b) a second electrode, with polarity opposite of the first electrode, disposed adjacent to a second current collector, wherein the second electrode supplies or accepts the metal ions, and wherein the second current collector is porous and permeable to the metal ions;

(c) a reference electrode disposed adjacent to a third current collector, wherein the reference electrode contains the metal ions;

(d) a first separator interposed between the first electrode and the second electrode, to electronically isolate the first electrode from the second electrode; and (e) a second separator interposed between the second current collector and the reference electrode, to electronically isolate the second electrode from the reference electrode.

In some embodiments, the reference electrode is not disposed spatially between the first electrode and the second electrode. In some embodiments, the reference electrode has a reference-electrode projected area that is at least 10%, 20%, 30%, 40%, 50%, 60%, 70%, 80%, or 90% or more of the projected area of the first electrode. In some embodiments, the reference electrode has a reference-electrode projected area that is at least 10%, 20%, 30%, 40%, 50%, 60%, 70%, 80%, or 90% or more of the projected area of the second electrode.

The metal ions may be selected from, but are not limited to, the group consisting of lithium ions, sodium ions, potassium ions, magnesium ions, calcium ions, and combinations thereof.

In certain embodiments, the metal ions are lithium ions, i.e. when the metal-ion battery structure is configured for a lithium-ion battery. When the battery is a lithium-ion battery, the reference electrode may be fabricated from one or more materials selected from the group consisting of lithium metal, lithiated carbon, lithium-silicon alloy, lithium-aluminum alloy, lithium-tin alloy, lithium-metal oxides $LiMO_2$ (M=Co, Ni, Mn, or combinations thereof), lithium-metal oxides $LiM_2O_4$ (M=Mn, Ti, or combinations thereof), lithium-metal oxides $LiM_xM'_{2-x}O_4$ (M, M'=Mn or Ni), lithium-metal phosphates $LiMPO_4$ (M=Fe, Mn, Co, or combinations thereof), and combinations thereof.

In some embodiments, the second current collector is in the form of mesh, foam, grid, net, woven fiber, honeycomb, patterned holes on metal foil, perforated holes on metal foil, metallized plastic film, expanded metal grid, metal wool, micro-truss, woven carbon fabric, woven carbon mesh, non-woven carbon mesh, carbon felt, or combinations thereof. The second current collector may be characterized by an average pore size from about 1 nm to about 10 μm. The second current collector may be characterized by an average pore-to-surface ratio or porosity from about 0.1% to about 99.9%. The average pore-to-surface ratio or porosity is at least 10%, in some embodiments. In certain embodiments, the second electrode is also porous.

The battery structure optionally further comprises an external reference circuit between the third current collector and the first current collector, wherein the external reference circuit is electrically connected to a monitor to display or record voltage of the first electrode. The battery structure optionally further comprises an external reference circuit between the third current collector and the second current collector, wherein the external reference circuit is electrically connected to a monitor to display or record voltage of the second electrode.

The battery structure may be disposed in a layered configuration. In some embodiments, the battery structure includes a reference electrode at one end of stacked layers. In these or other embodiments, the battery structure includes a reference electrode within stacked layers.

In some embodiments, the battery structure is in a cylindrical or wounded prismatic configuration. In these configurations, a reference electrode may be disposed as an outer layer, an inner layer, or both of these in the configuration.

The battery structure optionally further comprises at least one additional reference electrode. In some of these embodiments, the additional reference electrode is not disposed spatially between the first electrode and the second electrode.

Some variations provide a metal-ion battery structure comprising:

(a) a first electrode disposed adjacent to a first current collector, wherein the first electrode supplies or accepts selected battery metal ions;

(b) a second electrode, with polarity opposite of the first electrode, wherein the second electrode supplies or accepts the metal ions, and wherein the second electrode is porous, free-standing, and permeable to the metal ions;

(c) a reference electrode disposed adjacent to a second current collector, wherein the reference electrode contains the metal ions;

(d) a first separator interposed between the first electrode and the second electrode, to electronically isolate the first electrode from the second electrode; and (e) a second separator interposed between the second electrode and the reference electrode, to electronically isolate the second electrode from the reference electrode.

The invention also provides methods of dynamically monitoring battery voltages. Some variations provide a method of monitoring electrode potential of a battery, the method comprising:

(i) providing or obtaining a battery with a first electrode, a second electrode, and a reference electrode that is not spatially between the first and second electrodes;

(ii) operating the battery between the first electrode and the second electrode, to produce or receive power;

(iii) to monitor voltage of the first electrode, applying a first reference current in a first external reference circuit between the reference electrode and the first electrode, and displaying or recording the voltage of the first electrode; and (iv) to monitor voltage of the second electrode, applying a second reference current in a second external reference circuit between the reference electrode and the second electrode, and displaying or recording the voltage of the second electrode.

In some embodiments of these methods, the first reference current and the second reference current are independently selected from about 0.01 nA to about 1000 nA, such as from about 0.1 nA to about 10 nA.

In some embodiments, steps (iii) and (iv) are conducted at different times, and the first external reference circuit is optionally repositioned to be physically utilized as the second external reference circuit. In other embodiments, steps (iii) and (iv) are conducted simultaneously.

In some method embodiments, the battery includes:

(a) the first electrode disposed adjacent to a first current collector, wherein the first electrode supplies or accepts selected battery metal ions;

(b) the second electrode, with polarity opposite of the first electrode, disposed adjacent to a second current collector, wherein the second electrode supplies or accepts the metal ions, and wherein the second current collector is porous and permeable to the metal ions;

(c) the reference electrode disposed adjacent to a third current collector, wherein the reference electrode contains the metal ions;

(d) a first separator interposed between the first electrode and the second electrode, to electronically isolate the first electrode from the second electrode; and (e) a second separator interposed between the second current collector and the reference electrode, to electronically isolate the second electrode from the reference electrode.

In some method embodiments, the battery includes:

(a) the first electrode disposed adjacent to a first current collector, wherein the first electrode supplies or accepts selected battery metal ions;

(b) the second electrode, with polarity opposite of the first electrode, wherein the second electrode supplies or accepts the metal ions, and wherein the second electrode is porous, free-standing, and permeable to the metal ions;

(c) the reference electrode disposed adjacent to a second current collector, wherein the reference electrode contains the metal ions;

(d) a first separator interposed between the first electrode and the second electrode, to electronically isolate the first electrode from the second electrode; and (e) a second separator interposed between the second electrode and the reference electrode, to electronically isolate the second electrode from the reference electrode.

In some method embodiments, the battery is selected from the group consisting of a lithium-ion battery, a sodium-ion battery, a potassium-ion battery, a magnesium-ion battery, and a calcium-ion battery.

DETAILED DESCRIPTION OF EMBODIMENTS OF THE INVENTION

Figure 1:
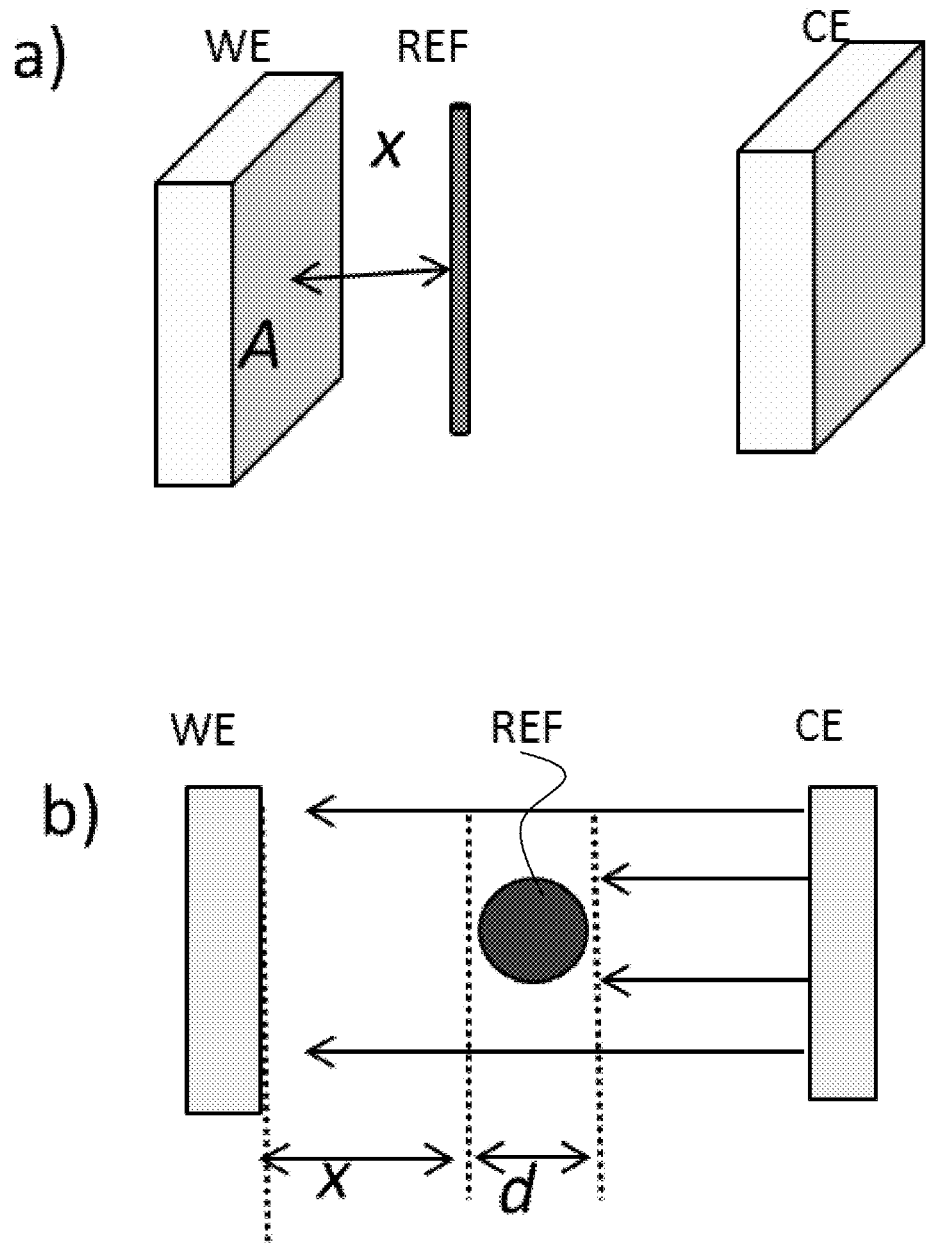
FIG. 1 illustrates some fundamental challenges associated with the incorporation of reference electrodes in batteries.

The structures, systems, and methods of the present invention will be described in detail by reference to various non-limiting embodiments and figures.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing parameters, conditions, results, and so forth used in the specification and claims are to be understood as being modified in all instances by the term "about." Accordingly, unless indicated to the contrary, the numbers set forth in the following specification and attached claims are approximations that may vary depending upon specific algorithms and calculations.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of"

Some variations of the invention are premised on new battery configurations that enable accurate in situ monitoring of the potentials of the cathode (positive electrode) and anode (negative electrode) under actual operation of a lithium-ion battery. In such configurations, a third electrode is incorporated as a reference electrode. Porous current collectors allow the communication of ions through the backside (away from the direct ion paths between the cathode and anode) where a reference electrode is inserted. The reference electrode is electronically isolated using one or more separators.

The primary functional components of a typical lithium-ion battery are the anode, cathode, and electrolyte, in which a lithium ion moves between the anode and cathode in the electrolyte. A separator is used to separate cathode and anode to prevent electron shortage. Current collectors, normally metal, are used to collect electrons from both cathode and anode. The lithium ion moves from the anode to the cathode during discharge and from the cathode to the anode when charging.

Both the anode and cathode are materials into which and from which lithium can migrate. The process of lithium moving into the anode or cathode is referred to as insertion (or intercalation), and the reverse process, in which lithium moves out of the anode or cathode is referred to as extraction (or deintercalation).

Battery capacity is primarily determined by the amount of active lithium traveling between the anode and the cathode. When the battery is charged for the first time, lithium leaves the cathode and enters the anode. After all removable lithium leaves the cathode, only part of that lithium is active in the anode because some lithium will typically be lost to form a solid-state electrolyte interface on the anode surface. During subsequent battery cycles, the amount of active lithium will be smaller than the storage capacity of both the cathode and the anode. Consequently, lithium battery capacity is usually equal to the amount of active lithium. Corrosion of this active lithium during the life of the battery leads directly to capacity loss.

The invention, in preferred variations, provides a battery structure that enables the direct measurement of the true potentials of both the cathode and the anode, using a reference electrode. The cathode and anode should be electronically separated by a separator, but ionically connected with electrolyte. Reference electrodes with large surface areas may be utilized, to minimize polarization resistance. In addition, the reference electrode may be disposed very close to the target electrodes, to minimize IR drop while avoiding the shielding effect. An IR drop is caused when a reference electrode is too far away from the target electrodes. The shielding effect is caused when a reference electrode blocks the current pathways between the positive and negative electrodes.

Preferred structural designs can greatly improve robustness of the reference electrode and accuracy of the cathode and anode potential data. These designs can be readily implemented in commercial cells. While the addition of the reference electrode will slightly reduce the overall cell energy density, this reduction will be more than compensated for by the benefits gain from dramatically improved battery health monitoring and battery safety. The invention can offer batteries with greatly simplified battery-management systems (e.g. improved accuracy with lower costs).

Embodiments of the present invention will now be described in detail, including reference to the accompanying figures. The figures provide representative illustration of the invention and are not limiting in their content. It will be understood by one of ordinary skill in the art that the scope of the invention extends beyond the specific embodiments depicted. In particular, for example, the invention is by no means limited to lithium-ion batteries.

Conventional reference electrodes suffer from two fundamental issues that compete with each other: (i) the reference electrode needs to be as close as possible to the target electrode to minimize the IR drop; (ii) conversely, the reference electrode needs to far enough from the target electrode to avoid a shielding effect that distorts the electrical current path between the cathode and anode.

This fundamental limitation is illustrated in FIG. 1. When voltage is measured using a reference electrode, the voltage can be express as follows:

$$E = E_{applied} - IR_{uncomp}$$

$$R_{uncomp} = x/(kA)$$

where x is the distance between the working electrode, WE, and reference electrode, REF; k is the electrolyte conductivity; and A is the surface area of the WE. Due to inadequate electrolyte conductivity (low k), the uncompensated resistance, $R_{uncomp}$, can be fairly high if the distance is too far away. FIG. 1(a) indicates that to minimize the uncompensated resistance due to inadequate electrolyte conductivity, the distance between WE and reference, x, need to be minimized.

FIG. 1(b) illustrates the shielding effect when the reference electrode is too close to the WE, where the presence of the reference electrode blocks the current pathway to WE. Due to the shielding effect between WE and the opposite electrode (CE), the distance should preferably be greater than twice the diameter of the reference electrode (x>2d).

The conventional wisdom is to use very thin wires (e.g., submicron in diameter) to reduce the shielding effect while getting closer to the target electrode. However, thin-wire reference electrodes often are associated with large polarization resistance. To avoid the distortion of the current pathways, some known designs place the reference electrode on the edge or the cross section of the battery electrodes, outside of the current path between the cathode and anode; however, the voltage readings will not be accurate due to edge effects and voltage interference.

Figure 2:
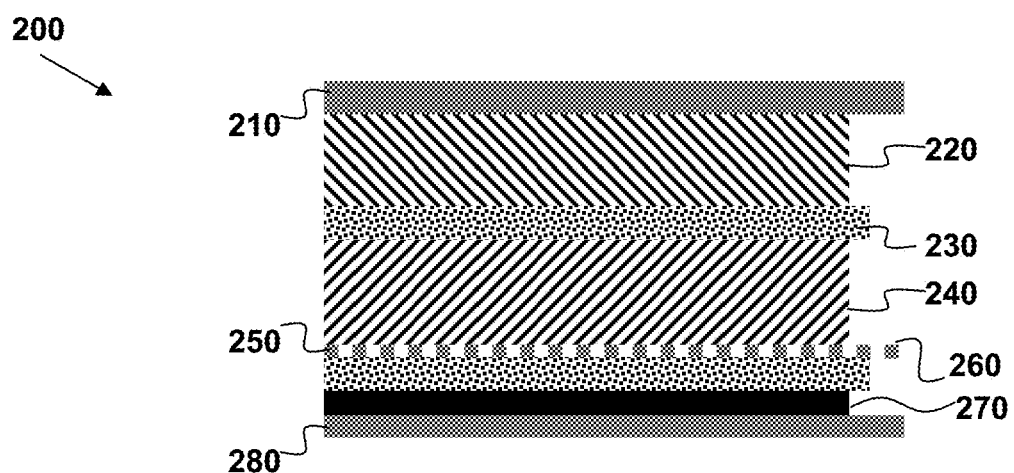
FIG. 2 depicts a cross-section of a battery cell structure with a reference electrode, in accordance with some variations of the invention.

The present inventors have realized that the aforementioned limitations can be mitigated by a different battery configuration. FIG. 2 is a schematic of a lithium-ion battery with a reference electrode that provides accurate monitoring of cathode and anode potentials under battery operation. The configuration includes a negative electrode material on copper foil, a positive electrode material on aluminum mesh, and a lithium metal reference electrode on copper foil. Each electrode is electronically isolated by separators.

FIG. 2 shows a cross section of a lithium-ion battery, in some embodiments of the invention. The battery structure 200 is in a layered configuration. A cathode 240 coated on a porous aluminum (Al) mesh current collector 250 faces an anode 220 coated on a copper (Cu) current collector 210 separated by a separator layer 230. The porous current collector 250 enables ion communication through the cathode. A reference electrode 270 (for example, lithium on copper foil 280) is disposed adjacent to the cathode 240 with Al mesh current collector 250. The reference electrode 270 is electronically isolated from the other electrodes by a separator layer 260. The anode 220 and cathode 240 may be switched, if desired.

When soaked in an organic electrolyte, the structure of FIG. 2 enables direct ion communication between the reference electrode and the cathode and anode, without blocking the current pathways of the battery. During normal battery operation, current is flowing between the cathode and anode. Application of a very small current between the cathode and the reference electrode enables voltage monitoring of the cathode, during battery operation. Likewise, application of a very small current between the anode and the reference electrode enables voltage monitoring of the anode, also during battery operation.

The reference current that should be applied between the reference electrode and cathode or anode is preferably less than about $10^{-6}$ amp (microamp), such as about $5 \times 10^{-7}$ amp, $10^{-7}$ amp, $5 \times 10^{-8}$ amp, $10^{-8}$ amp, or less. Preferably, the reference current is in the nanoamp (nA) range, such as about $9 \times 10^{-9}$ amp, $8 \times 10^{-9}$ amp, $7 \times 10^{-9}$ amp, $6 \times 10^{-9}$ amp, $5 \times 10^{-9}$ amp, $4 \times 10^{-9}$ amp, $3 \times 10^{-9}$ amp, $2 \times 10^{-9}$ amp, $10^{-9}$ amp, or less than $10^{-9}$ amp. In certain embodiments, the reference current is selected from about 0.5-2 nA, such as about 1 nA. The principles and scope of the invention work for reference currents higher than $10^{-6}$ amp, but such relatively high currents (compared to the current output of the battery) are not necessary for accurate voltage readings.

With reference to FIG. 2, the voltage between current collectors 210 and 250 is the normal battery voltage. The voltage between current collectors 210 and 280, when a reference current is applied, is the anode voltage. The voltage between current collectors 250 and 280, when a reference current is applied, is the cathode voltage. Subtraction of the cathode voltage from the anode voltage gives the monitored battery voltage. Because the actual battery voltage will generally be known, in the circuit between current collectors 210 and 250, an indication of accuracy can be provided by comparing the actual battery voltage with the monitored battery voltage. (See Examples 1 and 2 for illustrations of this verification technique.)

Some embodiments provide a metal-ion battery structure comprising:

(a) a first electrode disposed adjacent to a first current collector, wherein the first electrode supplies or accepts selected battery metal ions;

(b) a second electrode, with polarity opposite of the first electrode, disposed adjacent to a second current collector, wherein the second electrode supplies or accepts the metal ions, wherein the second current collector is porous and permeable to the metal ions, and wherein the second electrode is optionally porous;

(c) a reference electrode disposed adjacent to a third current collector, wherein the reference electrode contains the metal ions, and wherein the reference electrode is preferably not disposed spatially (i.e., in a direct path) between the first electrode and the second electrode;

(d) a first separator interposed between the first electrode and the second electrode, to electronically isolate the first electrode from the second electrode; and (e) a second separator interposed between the second current collector and the reference electrode, to electronically isolate the second electrode from the reference electrode.

The reference electrode may be rather large in terms of its "projected area," which means the geometric area of the surface as projected toward the anode or cathode. The reference electrode may have a reference-electrode projected area that is at least about 10%, 20%, 30%, 40%, 50%, 60%, 70%, 80%, 90%, 100% or more of the projected area of the anode and/or the cathode.

The metal ions may be selected from the group consisting of lithium ions, sodium ions, potassium ions, magnesium ions, calcium ions, and combinations thereof. In preferred embodiments, the metal ions are lithium ions.

The second current collector may be characterized by an average pore size from about 1 nm to about 10 µm, such as about 2 nm, 3 nm, 5 nm, 8 nm, 10 nm, 15 nm, 20 nm, 30 nm, 50 nm, 75 nm, 100 nm, 200 nm, 300 nm, 400 nm, 500 nm, 600 nm, 700 nm, 800 nm, 900 nm, 1 µm, 2 µm, 3 µm, 4 µm, 5 µm, 6 µm, 7 µm, 8 µm, or 9 µm.

The second current collector may be characterized by an average pore-to-surface ratio (in two dimensions) or porosity (in three dimensions) from about 0.1% to about 99.9%, such as about 0.5%, 1%, 2%, 3%, 4%, 5%, 10%, 15%, 20%, 25%, 30%, 35%, 40%, 45%, 50%, 55%, 60%, 65%, 70%, 75%, 80%, 85%, 90%, 95%, or 99%. In some embodiments, the average pore-to-surface ratio or porosity is at least 1%, 5%, 10%, 15%, or 20%.

The battery structure may further comprise an external reference circuit between the third current collector and the first current collector, wherein the external reference circuit is electrically connected to a monitor to display or record voltage of the first electrode. The battery structure may further comprise an external reference circuit between the third current collector and the second current collector, wherein the external reference circuit is electrically connected to a monitor to display or record voltage of the second electrode.

The present invention therefore also provides a method of monitoring electrode potential of a battery, the method comprising:

(i) providing or obtaining a battery with a first electrode, a second electrode, and a reference electrode that is not spatially between the first and second electrodes;

(ii) operating the battery between the first electrode and the second electrode, to produce or receive power;

(iii) to monitor voltage of the first electrode, applying a first reference current in a first external reference circuit between the reference electrode and the first electrode, and displaying or recording the voltage of the first electrode; and/or (iv) to monitor voltage of the second electrode, applying a second reference current in a second external reference circuit between the reference electrode and the second electrode, and displaying or recording the voltage of the second electrode.

In some embodiments, the first reference current and the second reference current are independently selected from about 0.01 nA to about 1000 nA, such as from about 0.1 nA to about 10 nA.

Steps (iii) and (iv) may be conducted at different times, if desired. The and first external reference circuit is optionally repositioned and used as the second external reference circuit. Alternatively, two physically distinct external reference circuits may be utilized. In some embodiments, steps (iii) and (iv) are conducted simultaneously, in which case physically distinct external reference circuits are needed.

The cathode and anode voltage thus may be dynamically monitored simultaneously, if desired. Alternatively, an electrode voltage may be monitored for some period of time, following by monitoring of another electrode present in the battery. The cathode and/or anode voltage may be monitored continuously, periodically, randomly, or on prescribed schedule with respect to battery operation. The voltages of cathode and anode may be displayed using one or more digital multimeters (or similar devices), and recorded on a computer for processing.

Figure 3:
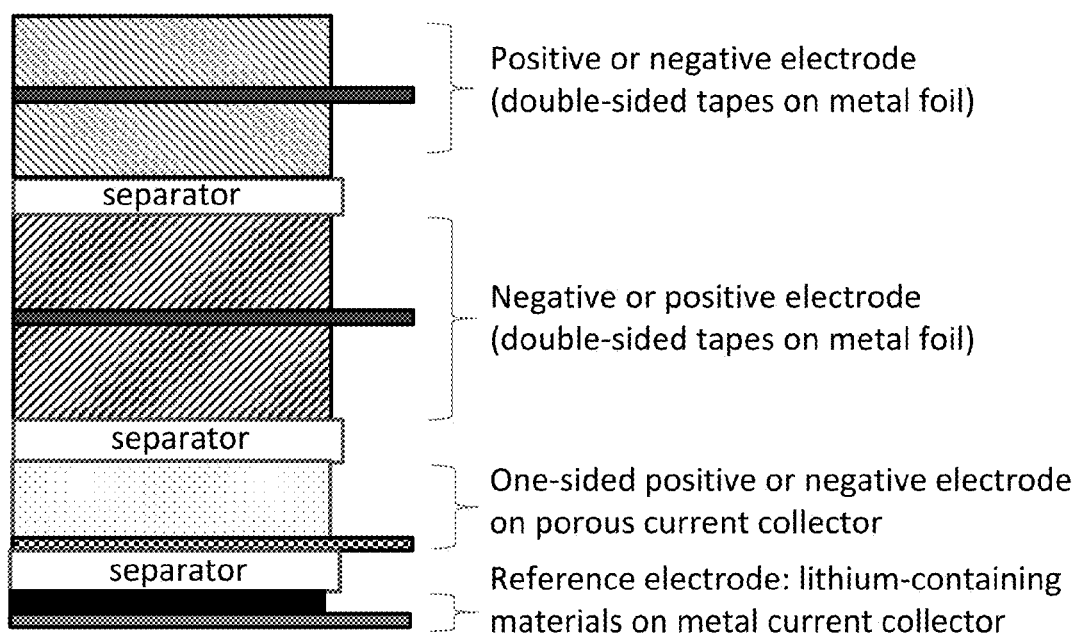
FIG. 3 depicts a cross-section of a battery cell structure with a reference electrode at the end of stacked layers, according to some embodiments.
Figure 4:
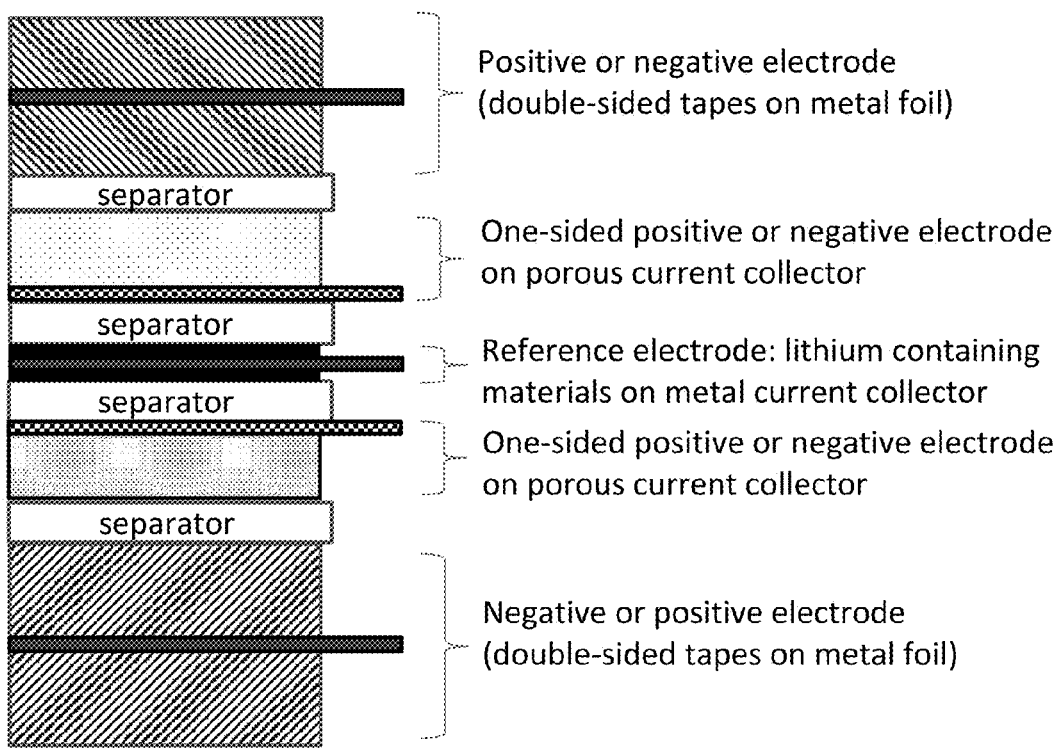
FIG. 4 depicts a cross-section of a battery cell structure with a reference electrode in the middle of stacked layers, according to some embodiments.
Figure 5:
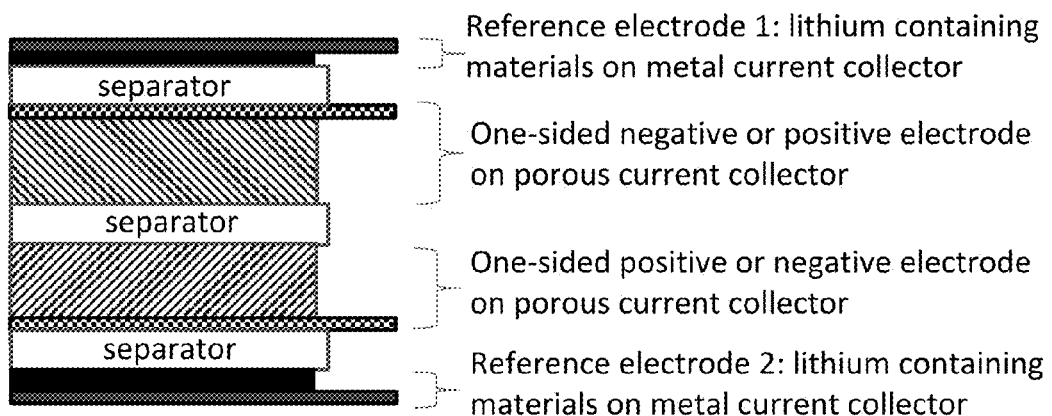
FIG. 5 depicts a cross-section of a battery cell structure with multiple reference electrodes, according to some embodiments.
Figure 6:
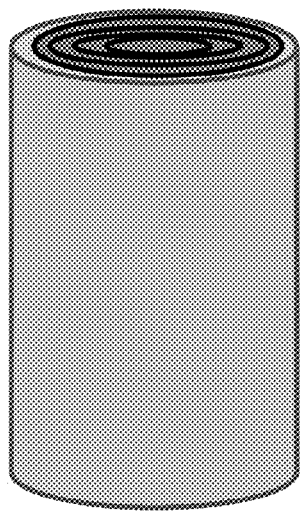
FIG. 6 illustrates a battery cell structure in cylindrical format or wounded prismatic format, according to some embodiments.
Figure 6:
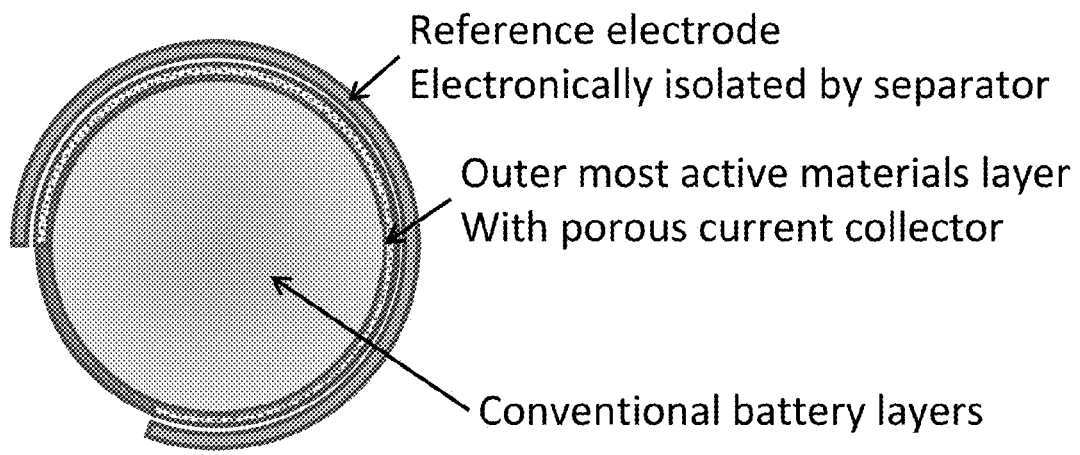
Figure 7:
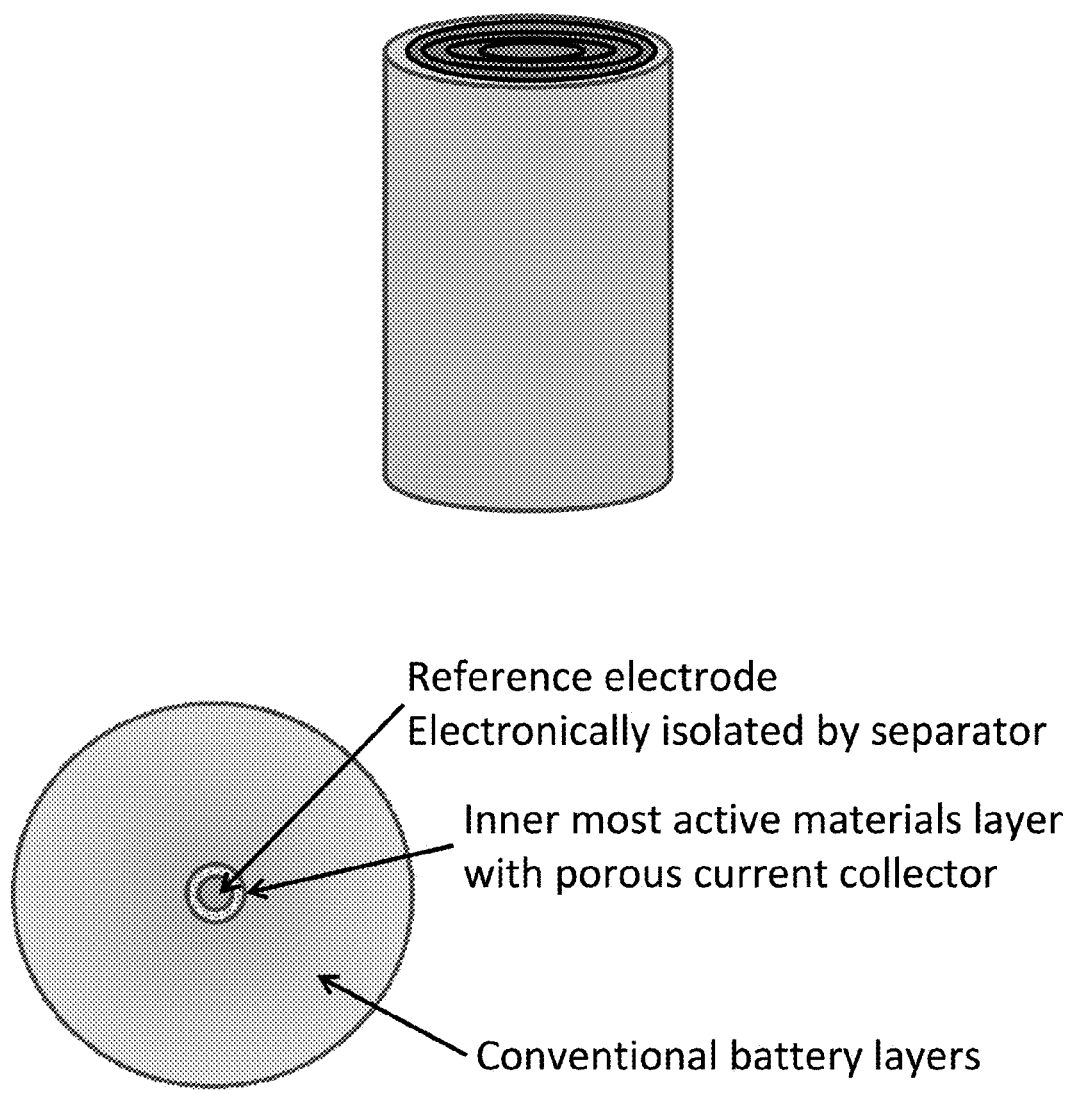
FIG. 7 illustrates a battery cell structure in cylindrical format or wounded prismatic format, according to some embodiments.

The principles of the invention may be applied in many other battery configurations beyond FIG. 2. For example (without limitation), FIGS. 3-7 depict various alternative battery structures that include one or more reference electrodes next to a positive electrode, a negative electrode, or both positive and negative electrodes. FIG. 3 illustrates a battery structure with reference electrode at the end of stacked layers. FIG. 4 illustrates a battery structure with reference electrode in the middle of stacked layers. FIG. 5 illustrates a battery configuration with multiple reference electrodes (which are not necessarily the same material). FIG. 6 depicts a reference electrode incorporated as an outer layer of a battery structure with cylindrical format or wounded prismatic format. FIG. 7 depicts a reference electrode incorporated as an inner layer of a battery structure with cylindrical format or wounded prismatic format.

Note that the positions of the anode and cathode may be switched in alternative embodiments. Generally, any of the multi-layered battery structures described herein may be repeated to increase the total capacity of the battery.

In some embodiments, one or more electrodes are freestanding and able to conduct electrons to or from an external circuit that is attached to the electrode. For such free-standing electrodes, a distinct current collector adjacent to the electrode is not necessary. For example, current collector 210 and/or current collector 280 are not present in some embodiments employing a free-standing anode 220 and/or a free-standing reference electrode 270, respectively.

For example, some embodiments provide a metal-ion battery structure comprising:

(a) a first electrode disposed adjacent to a first current collector, wherein the first electrode supplies or accepts selected battery metal ions;

(b) a second electrode, with polarity opposite of the first electrode, wherein the second electrode supplies or accepts the metal ions, and wherein the second electrode is porous, free-standing, and permeable to the metal ions;

(c) a reference electrode disposed adjacent to a second current collector, wherein the reference electrode contains the metal ions;

(d) a first separator interposed between the first electrode and the second electrode, to electronically isolate the first electrode from the second electrode; and (e) a second separator interposed between the second electrode and the reference electrode, to electronically isolate the second electrode from the reference electrode.

The anode 220 material must be capable of incorporating lithium ions during battery charging, and then releasing the lithium ions during battery discharge. Exemplary anode 220 materials suitable for the present invention include, but are not limited to, carbon materials such as graphite, coke, soft carbons, and hard carbons; and metals such as Si, Al, Sn, or alloys thereof. Other exemplary anode 220 materials include titanium oxides, germanium, copper/tin, and lithium compounds containing metal oxides, such as oxides of W, Fe, and Co. Anodes 220 can also include fillers and binders. The anode 220 material preferably exhibits long cycle life and calendar life, and does not experience significant resistance increase throughout the life of the battery.

Preferably, the anode 220 material consists essentially of graphitic carbon or another electron-conducting carbon. Some examples of electron-conducting carbon include natural graphites, such as flaky graphite, plate-like graphite, and other types of graphite; high-temperature sintered carbon products obtained, for example, from petroleum coke, coal coke, celluloses, saccharides, and mesophase pitch; artificial graphites, including pyrolytic graphite; carbon blacks, such as acetylene black, furnace black, Ketjen black, channel black, lamp black, and thermal black; asphalt pitch, coal tar, active carbon, mesophase pitch, and polyacetylenes.

The cathode 240 material must be capable of supplying lithium ions during battery charging, and then incorporating the lithium ions during battery discharge. The cathode 240 material can be, for example, a lithium metal oxide, phosphate, or silicate. Exemplary cathode materials suitable for the present invention include, but are not limited to, $LiMO_2$ (M=Co, Ni, Mn, or combinations thereof); $LiM_2O_4$ (M=Mn, Ti, or combinations thereof); $LiMPO_4$ (M=Fe, Mn, Co, or combinations thereof); and $LiM_xM'_{2-x}O_4$ (M, M'=Mn or Ni). The cathode 240 material preferably exhibits long cycle life and calendar life, and does not experience significant resistance increase throughout the life of the battery.

The cathode 240 may further include one or more conductive fillers to provide enhanced electronic conductivity. Examples of conductive fillers include, but are not limited to, conductive carbons, graphites, activated carbon fibers, non-activated carbon nanofibers, metal flakes, metal powders, metal fibers, carbon fabrics, metal mesh, and electrically conductive polymers. The cathode 240 may also further comprise other additives such as, for example, alumina, silica, and transition-metal chalcogenides.

The cathode 240 may also include a binder. The choice of binder material may vary widely so long as it is inert with respect to the other materials in the cathode. Useful binders are materials, usually polymeric, that allow for ease of processing of battery electrode composites and are generally known to those skilled in the art of electrode fabrication. Examples of useful binders include, but are not limited to, polytetrafluoroethylenes, polyvinylidene fluorides, ethylene-propylene-diene rubbers, polyethylene oxides, acrylates, methacrylates, divinyl ethers, and the like.

The reference electrode 270 material may vary widely. Preferably the reference electrode 270 material is stable over the life of the battery, and exhibits a known reference voltage. In preferred embodiments, the reference electrode 270 material possesses a flat voltage profile, i.e., the voltage does not change substantially at different states of charge.

The reference electrode 270 material may include one or more lithium-containing materials. Exemplary lithium-containing reference electrode materials include, but are not limited to, lithium metal, $LiMO_2$ (M=Co, Ni, Mn, or combinations thereof); $LiM_2O_4$ (M=Mn, Ti, or combinations thereof); $LiMPO_4$ (M=Fe, Mn, Co, or combinations thereof); and $LiM_xM'_{2-x}O_4$ (M, M'=Mn or Ni). Lithium-containing reference electrode materials may include lithium alloys of metals such as Si, Al, and Sn. Other exemplary lithium-containing reference electrode materials include lithium-containing compounds of carbon materials such as graphite, coke, soft carbons, and hard carbons. In certain embodiments, the reference electrode 270 material is selected from the group consisting of metallic lithium, lithium titanium oxide, lithium iron phosphate, lithiated silicon, and combinations thereof.

The surface area of a reference electrode may vary widely, such as from about 1 $mm^2$ to about 10 $cm^2$ or more. In some embodiments, the area of the reference electrode is as large as the actual size of the working electrode, such as its projection area as depicted in FIG. 1(a).

Current collectors 210 and 280 collect electrical current generated and provide an efficient surface for attachment of electrical contacts leading to the external circuit. The current collectors 210 and 280 may be made from any suitable materials, such as (but not limited to) Al, Cu, Ni, C, Ti, Au, or Pt. The current collectors 210 and 280 may also be fabricated from alloys, such as stainless steel. Some embodiments employ conducting carbonaceous materials for current collectors 210 and 280. Current collectors 210 and 280 may be porous or non-porous, such as 5-50 µm thick metal foils.

Current collector 250 also collects electrical current generated and provides an efficient surface for attachment of electrical contacts leading to the external circuit. The current collector 250 is porous to allow ion communication through the cathode 240 (or another electrode, in other embodiments). A porous current collector allows lithium ions to be transported through the material, in the direction of ion flow. Preferred forms of porous current collectors 250 include, but are not limited to, mesh, foam, grids, nets, woven fibers, honeycombs, patterned or perforated holes on metal foil, metallized plastic films, expanded metal grids, metal wools, woven carbon fabrics, woven carbon meshes, non-woven carbon meshes, and carbon felts, and structured patterns such as micro-trusses. The pore size in porous current collectors 250 may vary, such as from about 1 nm to about 10 µm. Pores may be imparted into current collectors by etching or some other means. The holes may be round, square, or some other shape.

Separators can be fabricated from any suitable material. Examples include cellulosic materials (e.g., paper), non-woven fabrics (e.g., cellulose/rayon non-woven fabric), microporous resin films, and porous metal foils. The separator can be an insulating thin film that is high in ion permeability and that has a prescribed mechanical strength. As the material of the separator, an olefin polymer, a fluorine-containing polymer, a cellulose polymer, a polyimide, a nylon, glass fiber, or alumina fiber, in the form of a non-woven fabric, a woven fabric, or a microporous film, may be used.

Lithium-ion batteries include a liquid electrolyte to conduct lithium ions. The liquid electrolyte acts as a carrier between the cathode and the anode when the battery passes an electric current through an external circuit, and also between the lithium reference electrode and the cathode or anode in accordance with this invention. Liquid or gel electrolytes may be employed. The electrolyte may be aqueous or nonaqueous.

The electrolyte generally includes a solvent and a lithium salt (anion plus lithium cation). Examples of the solvent that can be used include aprotic organic solvents, such as propylene carbonate, ethylene carbonate, butylene carbonate, dimethyl carbonate, diethyl carbonate, methyl ethyl carbonate, γ-butyrolactone, methyl formate, methyl acetate, 1,2-dimethoxyethane, tetrahydrofuran, 2-methyltetrahydrofuran, dimethyl sulfoxide, 1,3-dioxolane, formamide, dimethylformamide, dioxolane, dioxane, acetonitrile, nitromethane, ethyl monoglyme, phosphoric triesters, trimethoxymethane, dioxolane derivatives, sulfolane, 3-methyl-2-oxazolidinone, propylene carbonate derivatives, tetrahydrofuran derivatives, ethyl ether, 1,3-propanesultone, N-methyl acetamide, acetonitrile, acetals, ketals, sulfones, sulfolanes, aliphatic ethers, cyclic ethers, glymes, polyethers, phosphate esters, siloxanes, dioxolanes, and N-alkylpyrrolidones. Ethylene carbonate and propylene carbonate are preferable. As is known in the art, other minor components and impurities can be present in the electrolyte composition.

Lithium salts include, but are not limited to, $LiClO_4$, $LiBF_4$, $LiPF_6$, $LiCF_3SO_3$, $LiCF_3CO_2$, $LiAsF_6$, $LiSbF_6$, $LiAlCl_4$, LiCl, LiBr, and LiI, which may be used alone or as a mixture of two or more. $LiBF_4$ and $LiPF_6$ are preferable, in some embodiments. The concentration of the salt is not particularly limited, but preferably is about 0.1 to 5 mol/L of the electrolytic solution.

The amount of electrolytes to be used in the battery may vary. Preferred amounts will depend on the amounts of the cathode and anode active material and the size of the battery.

The battery can be packaged into either prismatic format cells or cylindrical cells. In the prismatic format, the stacked structure is preferably sealed with a packaging material capable of preventing air and water contamination of the battery. Three terminals should be employed to allow electrical access to the battery—terminals for each of the cathode, the anode, and the lithium reference electrode.

In the cylindrical format, the multi-layered structure will be wound into a jelly roll. The lithium reference electrode layer can be placed in the outmost layer, or another layer. The jelly roll can be sealed in a metal container after battery electrolyte is added. Such a battery will have three leads.

In some embodiments, the battery structure includes the reference electrode at one end of stacked layers. In some embodiments, the battery structure includes the reference electrode within stacked layers. The battery structure may be in a cylindrical or wounded prismatic configuration, with a reference electrode as an outer layer of the configuration, an inner layer of the configuration, or both. In certain embodiments, the battery structure further comprises at least one additional reference electrode which may be positioned such that it is not disposed spatially between the first electrode and the second electrode.

Lithium-ion batteries are typically included in a battery pack, which includes a plurality of electrochemical cells that are electrically connected in series and/or in parallel. Lithium-ion battery packs come in many shapes, sizes, capacities, and power ratings, depending on the intended use of the battery pack. Battery packs will typically include a number of lithium-ion cells and a thermal-management system. Open space or a heat-absorbing material may be incorporated between cells, to avoid excessive heating. Or, ceramic plates may be included between each cell, for example. A vent may be added to the battery box in case of thermal runaway reactions. In preferred embodiments utilizing this invention, the engineering overhead for thermal management is reduced by anode/cathode monitoring, thus increasing the effective system energy density.

Lithium-ion batteries according to this invention can be suitable for operating across a variety of temperature ranges. The temperature of lithium-ion battery operation can vary, as is known. Exemplary operation temperatures can be from −50° C. to 80° C., such as for military applications. For computers and related devices, as well as for electric-vehicle applications, an exemplary operation range is −30° C. to 60° C.

The scope of the invention, as mentioned above, is beyond lithium ions. In particular, the battery electrodes may be based on sodium (Na), potassium (K), or magnesium (Mg), for example. When alternative ions (other than Li) are employed, the reference electrode material should contain the alternative ions (e.g., $Na^+$, $K^+$, or $Mg^{2+}$).

The discharge capacity C (measured in amp-hour, or Ah) of a lithium-ion battery can be evaluated at various currents or, more commonly, at various C rates. The C rate is conventionally used to describe battery loads or battery charging in terms of time to charge or discharge C amp-hour. The C rate has the units of amp (or ampere), A, and is capacity C divided by time in hours. A C rate of 1 C means 1 hour to discharge C amp-hour. Other C rates can be employed to evaluate discharge capacity, such as C/2 (2 hours of discharge), C/6 (6 hours of discharge), and so on.

EXAMPLE 1

This Example 1 demonstrates monitoring of cathode and anode voltage behavior using a reference electrode incorporated in a prismatic pouch cell design.

Using the reference electrode design as depicted in FIG. 2 and described above, a lithium reference electrode is incorporated in a pouch cell design composed of a $LiNi_{1/3}Co_{1/3}Mn_{1/3}O_2$-based cathode material on Al mesh and a graphite-based anode on Cu foil. The positive electrode is composed of 84 wt % $LiNi_{1/3}Co_{1/3}Mn_{1/3}O_2$ (Toda Kogyo Corp., Hiroshima, Japan; trade name NCM-01ST), 3 wt % Super P carbon (MMM SA CARBON), 3 wt % KS6 (TIMCAL), and 10 wt % Kynar Flex 2801 (ELF ATOCHEM) and pressed onto Al mesh as a current collector. The negative electrode is composed of 89 wt % CGP-G8 (ConocoPhillips), 3 wt % Super P carbon (MMM SA CARBON), and 8 wt % Kynar Flex 2801 (ELF ATOCHEM) and casted onto copper foil. The lithium reference electrode is made from lithium metal compressed onto a copper foil. The capacities of the cathode and anode are evenly matched; that is, the capacity ratio between the cathode and anode is about 1. The electrolyte is 1 M $LiPF_6$ in (1:1 v/v) EC/DMC solution.

Figure 8:
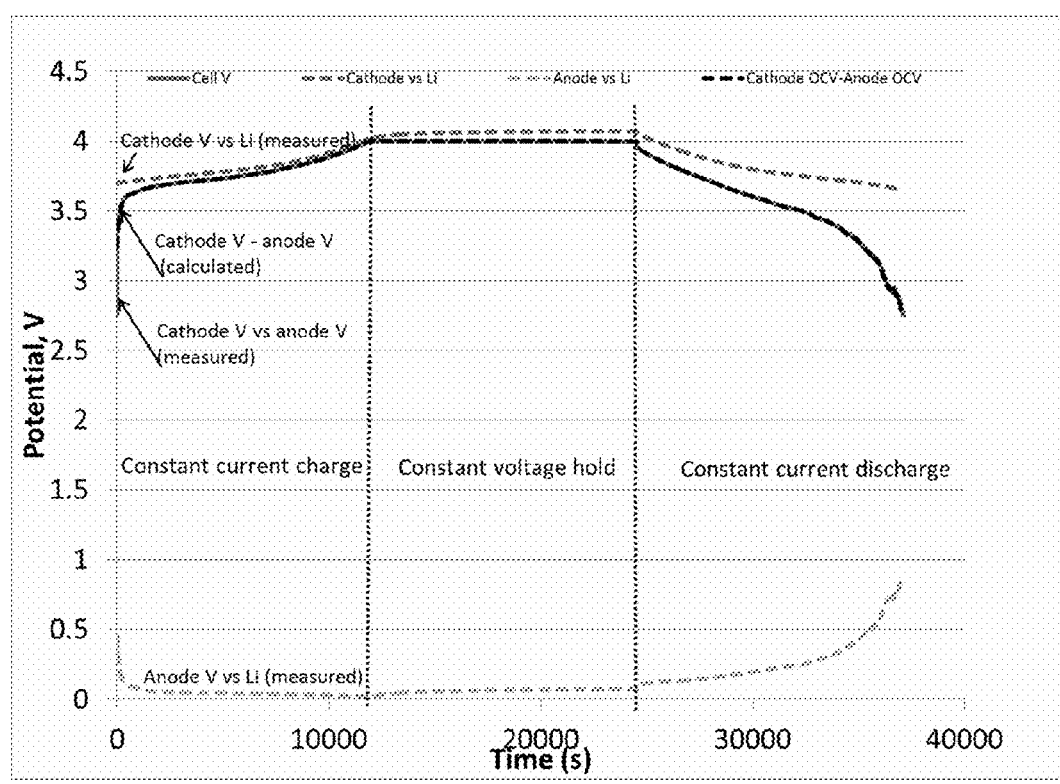
FIG. 8 shows data collected in Example 1 in which voltage behavior of cathode and anode is measured using a lithium reference electrode.

The electrochemical experiments are carried out using an Arbin battery tester at a C/10 rate with a cutoff voltage of 2.7 V and 4.0 V for the cell. The voltages of cathode and anode are separately recorded using two digital multimeters. The results are shown in FIG. 8 in which measured cell voltage, cathode voltage, and anode voltage are plotted. Voltage behavior of cathode (top, dashed line) and anode (bottom, dashed line) is measured using the lithium reference electrode.

The measured cell voltage is also compared with the calculated cell voltage using the measured cathode voltage minus the measured anode voltage. The calculated values are shown as a dashed line, while the measured values are shown as a solid line; the dashed line and solid line essentially coincide in FIG. 8. Therefore the calculated voltage results agree well with the measured voltages, indicating that the measured voltages using the reference electrode reflect the true voltage values of the cathode and the anode.

EXAMPLE 2

This Example 2 demonstrates monitoring of cathode and anode voltage behavior using a reference electrode at higher rates.

Using the reference electrode design as depicted in FIG. 2 and described above, a lithium reference electrode is incorporated in a pouch cell design composed of a $LiNi_{1/3}Co_{1/3}Mn_{1/3}O_2$-based cathode material on Al mesh and a graphite-based anode on Cu foil. The positive electrode is composed of 84 wt % $LiNi_{1/3}Co_{1/3}Mn_{1/3}O_2$ (Toda Kogyo Corp, NCM-01ST), 3 wt % Super P carbon (MMM SA CARBON), 3 wt % KS6 (TIMCAL), and 10 wt % Kynar Flex 2801 (ELF ATOCHEM) and pressed onto Al mesh as a current collector. The negative electrode is composed of 89 wt % CGP-G8 (ConocoPhillips), 3 wt % Super P carbon (MMM SA CARBON), and 8 wt % Kynar Flex 2801 (ELF ATOCHEM) and casted onto copper foil. The lithium reference electrode is made from lithium metal compressed onto a copper foil. The capacities of the cathode and anode are evenly matched; that is, the capacity ratio between the cathode and anode is about 1. The electrolyte is 1M $LiPF_6$ in (1:1 v/v) EC/DMC solution.

Figure 9:
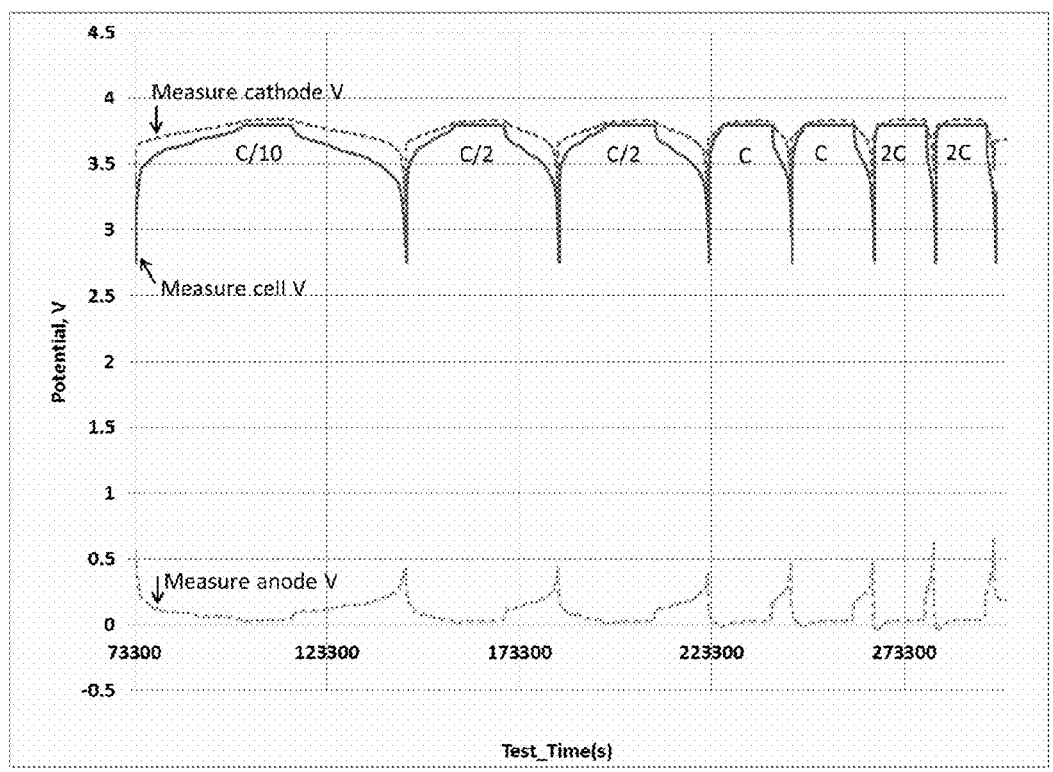
FIG. 9 shows data collected in Example 2 in which voltage behavior of cathode and anode is measured using a lithium reference electrode at higher rates, compared to Example 1.

The electrochemical experiments are carried out using an Arbin battery tester at various rates from C/10, C/2, C, to 2 C with a cutoff voltage of 2.7 V and 3.8 V for the cell. The voltages of cathode and anode are separately recorded using two digital multimeters. The results are shown in FIG. 9 in which measured cell voltage, cathode voltage, and anode voltage are plotted. Voltage behavior of cathode (top, dashed line) and anode (bottom, dashed line) is measured using the lithium reference electrode. The voltage of the cell is also measured (solid line).

The incorporation of reference electrodes using porous current collectors has been experimentally shown, in Examples 1 and 2, to mitigate or eliminate fundamental issues with conventional reference electrode design. The disclosed battery configurations enable the use of large reference electrode area to minimize polarization; allow smalls distances (micrometer scale) between the reference electrode and the target electrodes; and can be readily implemented in commercial cells without major modifications of the battery cell design.

This invention will benefit commercial applications where battery safety, battery health and battery life information are important. Especially for automobiles and airplanes, knowledge of battery health/life information as well as battery safety is critical to meet customer satisfaction. Direct measurements of the battery electrode potentials can greatly improve the battery safety and enhance the accuracy and reliability of battery management. Thus, the current invention can simplify the design of battery management systems and battery health/life monitoring systems. Variations of this invention can allow for simplified thermal-management designs for battery packs, thereby reducing cost and weight.

The current invention will also impact other commercial military and space applications such as consumer portable electronics, electric bikes, power tools, aircrafts, and satellites that can benefit from better health/life monitoring at a reduced costs. Generally, practical applications for this invention include, but are not limited to, laptop computers, mobile phones, cameras, medical devices, electric vehicles, electric bikes, scooters, and power tools.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A metal-ion battery structure comprising:
   (a) a first electrode disposed adjacent to a first current collector, wherein said first electrode supplies or accepts selected battery metal ions;
   (b) a second electrode, with polarity opposite of said first electrode, disposed adjacent to a second current collector, wherein said second electrode supplies or accepts said metal ions, and wherein said second current collector is porous, permeable to said metal ions, and characterized by an average pore size from about 1 nm to about 10 μm;
   (c) a reference electrode disposed adjacent to a third current collector, wherein said reference electrode contains said metal ions; and wherein said reference electrode has a reference-electrode projected area that is at least 20% of the projected area of said first electrode and of said second electrode;
   (d) a first separator interposed between said first electrode and said second electrode, to electronically isolate said first electrode from said second electrode; and
   (e) a second separator interposed between said second current collector and said reference electrode, to electronically isolate said second electrode from said reference electrode.

2. The battery structure of claim 1, wherein said reference electrode is not disposed spatially between said first electrode and said second electrode.

3. The battery structure of claim 1, wherein said reference electrode has a reference-electrode projected area that is at least 30% of the projected area of said first electrode.

4. The battery structure of claim 3, wherein said reference electrode has a reference-electrode projected area that is at least 50% of the projected area of said first electrode.

5. The battery structure of claim 4, wherein said reference electrode has a reference-electrode projected area that is at least 90% of the projected area of said first electrode.

6. The battery structure of claim 1, wherein said reference electrode has a reference-electrode projected area that is at least 30% of the projected area of said second electrode.

7. The battery structure of claim 6, wherein said reference electrode has a reference-electrode projected area that is at least 50% of the projected area of said second electrode.

8. The battery structure of claim 7, wherein said reference electrode has a reference-electrode projected area that is at least 90% of the projected area of said second electrode.

9. The battery structure of claim 1, wherein said metal ions are selected from the group consisting of lithium ions, sodium ions, potassium ions, magnesium ions, calcium ions, and combinations thereof.

10. The battery structure of claim 9, wherein said metal ions are lithium ions.

11. The battery structure of claim 10, wherein said reference electrode is fabricated from one or more materials selected from the group consisting of lithium metal, lithiated carbon, lithium-silicon alloy, lithium-aluminum alloy, lithium-tin alloy, lithium-metal oxides $LiMO_2$ (M=Co, Ni, Mn, or combinations thereof), lithium-metal oxides $LiM_2O_4$ (M=Mn, Ti, or combinations thereof), lithium-metal oxides $LiM_xM'_{2-x}O_4$ (M, M' =Mn or Ni), lithium-metal phosphates $LiMPO_4$ (M=Fe, Mn, Co, or combinations thereof), and combinations thereof.

12. The battery structure of claim 1, wherein said second current collector is in the form of mesh, foam, grid, net, woven fiber, honeycomb, patterned holes on metal foil, perforated holes on metal foil, metallized plastic film, expanded metal grid, metal wool, micro-truss, woven carbon fabric, woven carbon mesh, non-woven carbon mesh, carbon felt, or combinations thereof.

13. The battery structure of claim 1, wherein said second current collector is characterized by an average pore-to-surface ratio or porosity from about 0.1% to about 99.9%.

14. The battery structure of claim 13, wherein said average pore-to-surface ratio or porosity is at least 10%.

15. The battery structure of claim 1, wherein said second electrode is porous.

16. The battery structure of claim 1, said battery structure further comprising an external reference circuit between said third current collector and said first current collector, wherein said external reference circuit is electrically connected to a monitor to display or record voltage of said first electrode.

17. The battery structure of claim 1, said battery structure further comprising an external reference circuit between said third current collector and said second current collector, wherein said external reference circuit is electrically connected to a monitor to display or record voltage of said second electrode.

18. The battery structure of claim 1, wherein said battery structure is in a layered configuration.

19. The battery structure of claim 18, wherein said battery structure includes said reference electrode at one end of stacked layers.

20. The battery structure of claim 18, wherein said battery structure includes said reference electrode within stacked layers.

21. The battery structure of claim 1, wherein said battery structure is in a cylindrical or wounded prismatic configuration.

22. The battery structure of claim 21, wherein said battery structure includes said reference electrode as an outer layer of said configuration.

23. The battery structure of claim 21, wherein said battery structure includes said reference electrode as an inner layer of said configuration.

24. The battery structure of claim 1, said battery structure further comprising at least one additional reference electrode.

25. The battery structure of claim 24, wherein said additional reference electrode is not disposed spatially between said first electrode and said second electrode.

26. A metal-ion battery structure comprising:
(a) a first electrode disposed adjacent to a first current collector, wherein said first electrode supplies or accepts selected battery metal ions;
(b) a second electrode, with polarity opposite of said first electrode, wherein said second electrode supplies or accepts said metal ions, and wherein said second electrode is porous, free-standing, permeable to said metal ions, and characterized by an average pore size from about 1 nm to about 10 μm;
(c) a reference electrode disposed adjacent to a second current collector, wherein said reference electrode contains said metal ions, and wherein said reference electrode has a reference-electrode projected area that is at least 20% of the projected area of said first electrode and of said second electrode;
(d) a first separator interposed between said first electrode and said second electrode, to electronically isolate said first electrode from said second electrode; and
(e) a second separator interposed between said second electrode and said reference electrode, to electronically isolate said second electrode from said reference electrode.

27. A method of monitoring electrode potential of a battery, said method comprising:
(i) providing or obtaining a battery with a first electrode, a second electrode, and a reference electrode that is not spatially between said first and second electrodes, wherein said reference electrode has a reference-electrode projected area that is at least 20% of the projected area of said first electrode and of said second electrode, and wherein said second electrode is porous, permeable to selected battery metal ions, and characterized by an average pore size from about 1 nm to about 10 μm;
(ii) operating said battery between said first electrode and said second electrode, to produce or receive power;
(iii) to monitor voltage of said first electrode, applying a first reference current in a first external reference circuit between said reference electrode and said first electrode, and displaying or recording said voltage of said first electrode; and
(iv) to monitor voltage of said second electrode, applying a second reference current in a second external reference circuit between said reference electrode and said second electrode, and displaying or recording said voltage of said second electrode.

28. The method of claim 27, wherein said first reference current and said second reference current are independently selected from about 0.01 nA to about 1000 nA.

29. The method of claim 28, wherein said first reference current and said second reference current are independently selected from about 0.1 nA to about 10 nA.

30. The method of claim 27, wherein steps (iii) and (iv) are conducted at different times, and wherein said first external reference circuit is optionally repositioned as said second external reference circuit.

31. The method of claim 27, wherein steps (iii) and (iv) are conducted simultaneously.

32. The method of claim 27, wherein said battery includes:
(a) said first electrode disposed adjacent to a first current collector, wherein said first electrode supplies or accepts said metal ions;
(b) said second electrode, with polarity opposite of said first electrode, disposed adjacent to a second current collector, wherein said second electrode supplies or accepts said metal ions;
(c) said reference electrode disposed adjacent to a third current collector, wherein said reference electrode contains said metal ions;
(d) a first separator interposed between said first electrode and said second electrode, to electronically isolate said first electrode from said second electrode; and
(e) a second separator interposed between said second current collector and said reference electrode, to electronically isolate said second electrode from said reference electrode.

33. The method of claim 27, wherein said battery includes:
(a) said first electrode disposed adjacent to a first current collector, wherein said first electrode supplies or accepts said metal ions;
(b) said second electrode, with polarity opposite of said first electrode, wherein said second electrode supplies or accepts said metal ions, and wherein said second electrode is free-standing;
(c) said reference electrode disposed adjacent to a second current collector, wherein said reference electrode contains said metal ions;
(d) a first separator interposed between said first electrode and said second electrode, to electronically isolate said first electrode from said second electrode; and
(e) a second separator interposed between said second electrode and said reference electrode, to electronically isolate said second electrode from said reference electrode.

34. The method of claim 27, wherein said battery is selected from the group consisting of a lithium-ion battery, a sodium-ion battery, a potassium-ion battery, a magnesium-ion battery, and a calcium-ion battery.

35. The method of claim 34, wherein said battery is a lithium-ion battery.

* * * * *